United States Patent
Takashima et al.

(10) Patent No.: US 7,248,493 B2
(45) Date of Patent: Jul. 24, 2007

(54) MEMORY SYSTEM HAVING IMPROVED RANDOM WRITE PERFORMANCE

(75) Inventors: Daisaburo Takashima, Yokohama (JP); Shuso Fujii, Kawasaki (JP); Takuya Futatsuyama, Yokohama (JP); Takaya Suda, Kamakura (JP); Masaki Momodomi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/277,706

(22) Filed: Mar. 28, 2006

(65) Prior Publication Data

US 2006/0274565 A1 Dec. 7, 2006

(30) Foreign Application Priority Data

Jun. 2, 2005 (JP) ............................. 2005-162796

(51) Int. Cl.
*G11C 7/00* (2006.01)
(52) U.S. Cl. .................. 365/145; 365/230.06
(58) Field of Classification Search ................ 365/145, 365/230.06
See application file for complete search history.

(56) References Cited

U.S. PATENT DOCUMENTS

| 2005/0180729 A1* | 8/2005 | Kihara et al. ................. 386/46 |
| 2006/0200617 A1* | 9/2006 | Park ........................... 711/103 |
| 2007/0033373 A1* | 2/2007 | Sinclair ...................... 711/203 |
| 2007/0058475 A1* | 3/2007 | Yamagami et al. .... 365/230.01 |

FOREIGN PATENT DOCUMENTS

| JP | 2003-85037 | 3/2003 |
| JP | 2003-256269 | 9/2003 |

* cited by examiner

*Primary Examiner*—Michael Tran
(74) *Attorney, Agent, or Firm*—Oblon, Spivak, McClelland, Maier & Neustadt, P.C.

(57) ABSTRACT

A memory system includes a ferroelectric memory, flash EEPROM, control circuit, and interface circuit. The control circuit is configured to control the ferroelectric memory and flash EEPROM. The interface circuit is configured to communicate externally. Data is programmed in the flash EEPROM by a write unit which is smaller than a block as an erase unit and larger than a page as a program unit. The ferroelectric memory stores a logical address-physical address conversion table using the write unit.

18 Claims, 9 Drawing Sheets

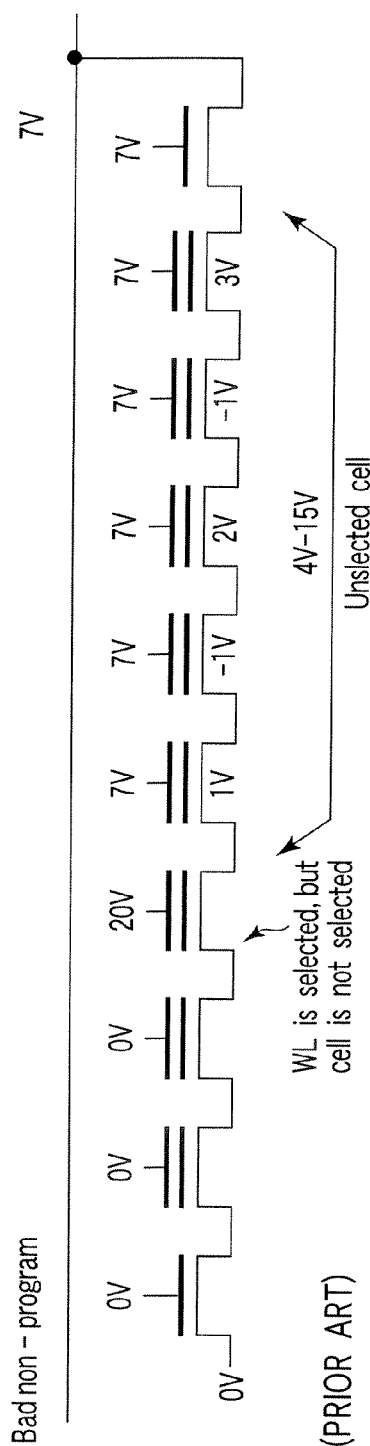
FIG. 4B (PRIOR ART)
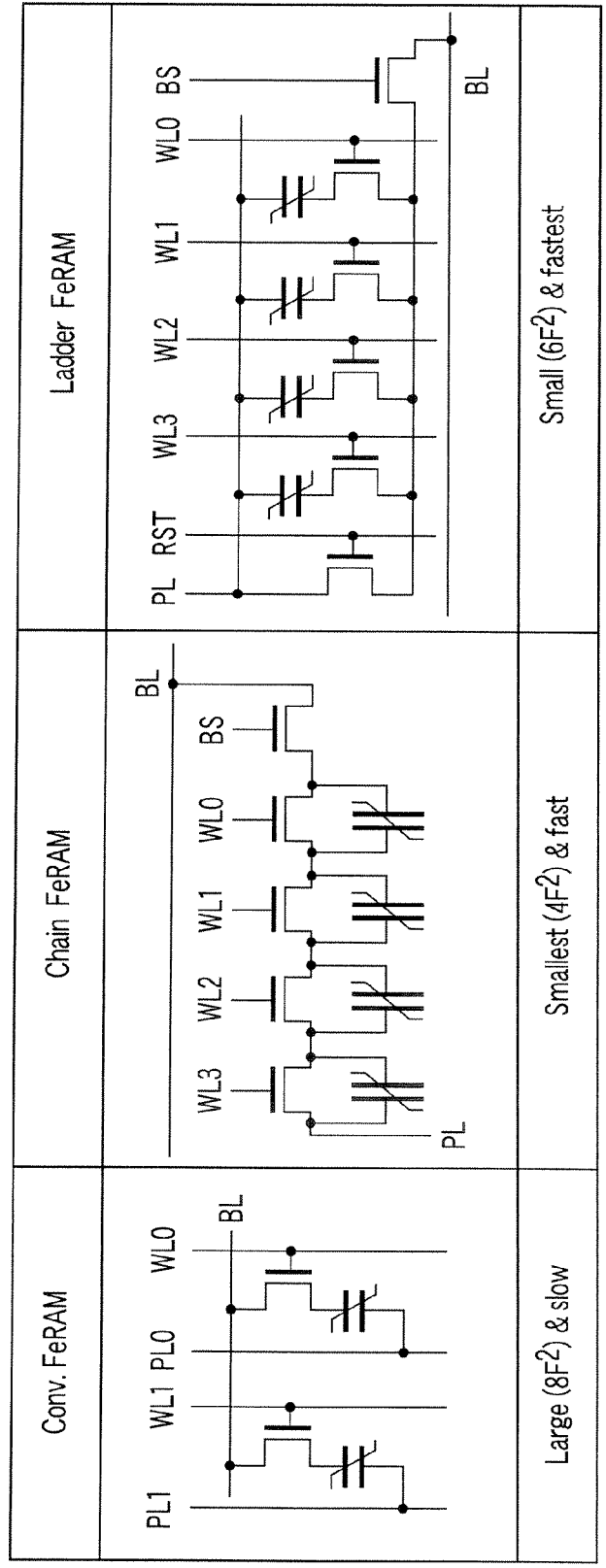
FIG. 5A (PRIOR ART)
FIG. 5B (PRIOR ART)
FIG. 5C (PRIOR ART)

Logical to physical address
mapping FeRAM memory data

| Physical | Logical | Data |
|----------|---------|------|
| 000000   | 000001  | 0    |
| 000001   | 000100  | 1    |
| 000010   | 000010  | 0    |
| 000011   | 111100  | 0    |
| ⋮        | ⋮       | ⋮    |
| 111111   | 000011  | 1    |

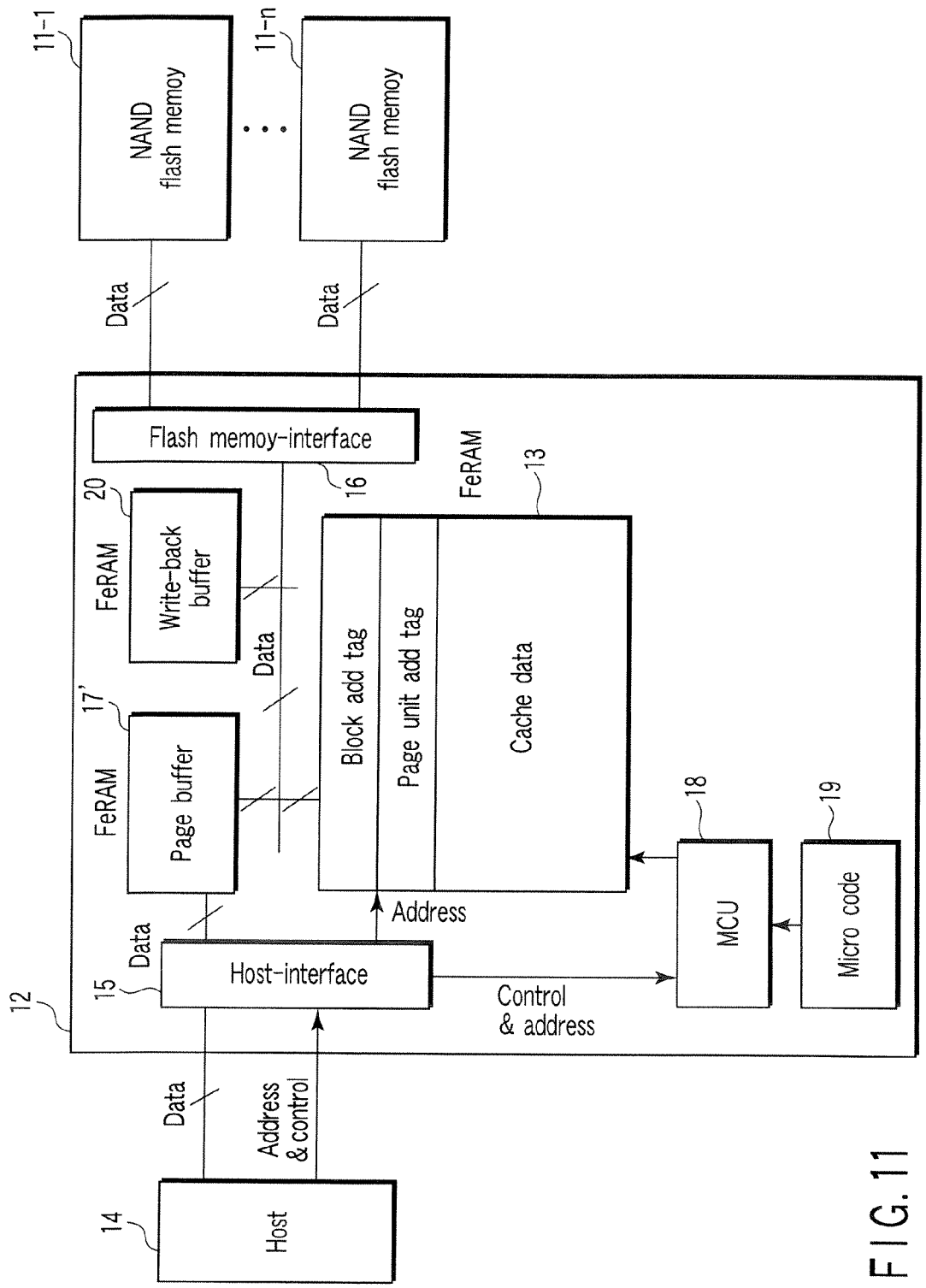
F I G. 11

MEMORY SYSTEM HAVING IMPROVED RANDOM WRITE PERFORMANCE

CROSS-REFERENCE TO RELATED APPLICATIONS

This application is based upon and claims the benefit of priority from prior Japanese Patent Application No. 2005-162796, filed Jun. 2, 2005, the entire contents of which are incorporated herein by reference.

BACKGROUND OF THE INVENTION

1. Field of the Invention

The present invention relates to a memory system which combines a multilevel NAND flash EEPROM type nonvolatile memory having a large capacity but limited in program sequence of a page in a block, an FeRAM having a medium capacity but capable of high-speed read/write, and a controller for controlling these memories, and which apparently gives randomness to page programming in a block of the multilevel NAND flash EEPROM type nonvolatile memory, thereby greatly improving the performance of random write applications such as an OS operation.

2. Description of the Related Art

Semiconductor memories are presently widely used in many apparatuses such as main memories of mainframe and personal computers, household electric appliances, and cellphones. Those which are predominate in the market are flash EEPROM type nonvolatile memories represented by a NAND flash memory, and various types of memory cards (SD card, MMC card, MS card, and CF card) are used as media for storing information such as still images, motion images, sounds, and games in storage media of, e.g., digital cameras, digital videos, music players such as MP3, mobile PC's, and digital TV. USB compatible cards are also extensively used as storage media of PCs.

The flash EEPROM type nonvolatile memories are roughly classified into a NOR memory and NAND memory. The NOR memory can perform high-speed write, and can also perform read about $10^{13}$ times. This NOR memory is used to store instruction codes in a mobile gear. However, the NOR memory is unsuitable for file recording because the effective bandwidth of write is small.

On the other hand, the NAND memory can be highly integrated compared to the NOR memory. Although the access time is as long as 25 µs, burst read can be performed, and the effective bandwidth is large. Also, the program time and erase time of write are as long as 200 µs and about 1 ms, respectively, but a large number of bits can be programmed or erased at once. This makes it possible to load write data in a burst manner and program a large number of bit pages at once. Therefore, the NAND memory is a memory having a large effective bandwidth. By making the most of these advantages, the NAND memories are used in memory cards and USB memories as described above, and are recently used in memories of cellphones.

FIG. 1 shows a circuit diagram of a memory cell block of a NAND flash EEPROM, and a block diagram of a cell array of the same. Since memory cells are arranged one by one at the intersections of word lines WL0, WL1, ..., WL7 and bit lines BL0, BL1, ..., BL3, this memory is most suitable for high integration. A plurality of floating gate type transistors are connected in series, and selection transistors are arranged on the side of the bit lines BL0, BL1, ..., BL3, and on the side of a source line SL.

In the above arrangement, a unit for performing erase is a memory cell block unit in the upper portion of FIG. 1 when viewed in the bit direction, and is one entire mat in the lower portion of FIG. 1 when viewed in the word line direction, and the erase unit is divided by a capacity of about 256 KB. This erase unit is called a block.

A program unit corresponds to one word line in the erase block and every other bit line (an even-numbered bit line EvenBL or odd-numbered bit line OddBL). When the number of series-connected cells is 32, the program unit is 256 KB/32/2=4 KB. This program unit is called a page. In this example, the block/page ratio is 64. One of the odd-numbered bit lines OddBL and even-numbered bit lines EvenBL is read in a read operation as well. When the even-numbered bit line EvenBL is to be read, for example, the odd-numbered bit line OddBL is set at Vss in order to reduce the interference noise between them.

FIGS. 2A to 2D illustrate examples of read, program, and erase operations of the NAND flash memory. In the read operation, as shown in FIG. 2A, the word line of a cell to be read is set at 0V, and the rest is changed to High. If a threshold voltage Vt of the cell transistor is Vt>0, the BL changes to Low. If Vt<0, the BL stays High, and the cell data is read out.

In the erase operation, as shown in FIG. 2D, the well potential of the whole cell block is set at 20V, and the rest is set at 0V, thereby drawing electrons of the floating gate to the well by a tunneling current to make the threshold voltage Vt lower than 0V. Accordingly, the erase unit is a large unit of 256 KB.

As shown in FIG. 2B, the program operation is performed by respectively setting the word line and bit line of a selected cell at 20V and 0V, thereby raising the threshold voltage by injecting electrons into the floating gate by a tunneling current.

In this state, as shown in FIG. 2C, the word line of each unselected cell in the same block is set at about 7V to decrease the applied voltage to a unselected transistor and suppress write. For a bit not to be written of the selected word line, the bit line is set at 7V, and a unselected word line is raised to 7V to boot the source and drain voltages of the cell transistor to about 10V, thereby suppressing write. This example is a binary method which stores 1-bit information in one cell. Recently, however, a four-valued method which stores 2-bit information in one cell is beginning to be used.

FIG. 3 shows a case in which four values are given to the threshold voltage of a cell transistor in one cell. In the first programming, 1 or 0 is written in a lower bit. In the second programming, an upper bit is written. This gives the four threshold voltage distributions. Although this quaternary method is suited to increasing the density, the threshold voltage Vt of the cell transistor must be suppressed to the distribution within a narrow range. This makes the program time and erase time longer than those of the binary method. In addition, a read operation requires determination at least twice, so it takes a long time to start reading out data.

As described above, the multilevel NAND flash EEPROM type nonvolatile memory has a lower operating speed and tighter allowable threshold voltage distribution than those of the binary memory.

FIGS. 4A and 4B each show the internal node potential of a block connected to an unselected bit line in a selected block. As shown in FIG. 4A, when data is to be programmed in a cell connected to one word line in the block, no problem arises if a cell closer to a bit line than the selected cell is kept erased. However, as shown in FIG. 4B, when no data is to be programmed in an unselected cell connected to one selected word line in the block, if a cell closer to a bit line than the unselected cell is already programmed, the threshold voltage of each memory cell transistor changes, and this changes the capacitance of an inverting layer. As a consequence, the source and drain potentials of the cell to be booted change.

More specifically, after a bit line is set at 7V and 7V are applied to a block select line on the bit line side, if a word line connected to a cell other than a selected cell is set at 7V, clamping occurs at the threshold voltage of a block select transistor, and the source-drain node of each transistor is booted. This boot potential fluctuates in accordance with the value of programming of an unselected cell. In this case, the source potential of a cell which is connected to a selected word line and is not to be programmed largely fluctuates. Consequently, this cell is weakly programmed to cause an operation error in a read operation.

On the other hand, a cell closer to the source line than the selected word line is not programmed but safely protected by setting the word line at 0V. To avoid this problem, write must be performed in the direction from the source line to the bit line in the multilevel NAND flash EEPROM type nonvolatile memory. That is, the order of pages to be programmed in a block must be fixed or limited.

Accordingly, although data can be written page by page by using the multilevel NAND flash EEPROM type nonvolatile memory, the order of pages is limited, so no random data write is possible. As a consequence, data can be written only block by block.

One solution to the problem of the NAND flash as described above is a ferroelectric memory (to be referred to as an FeRAM hereinafter) capable of high-speed read/write as a storage medium similarly to a DRAM, and also capable of storing information even when the power supply is turned off. In addition to the ability to perform high-speed read/write, the ferroelectric memory can be rewritten $10^{13}$ to $10^{16}$ times, has a read/write time equivalent to that of a DRAM, and can operate at 3 to 5V. The ferroelectric memory having these advantages is also called an ultimate memory. The use of the ferroelectric memory can solve the problem of slow read/write of the NAND flash.

Unfortunately, the FeRAM is presently not so highly integrated as the NAND flash, and therefore incurs a high cost.

The FeRAM will be briefly explained below. FIG. 5A shows a memory cell having one transistor and one capacitor of a conventional ferroelectric memory. In this memory cell of the conventional ferroelectric memory, the transistor and capacitor are connected in series. A cell array includes a bit line BL for reading out data, word lines WL0 and WL1 for selecting a memory cell transistor, and plate lines PL0 and PL1 for driving one terminal of the ferroelectric capacitor.

In this conventional ferroelectric memory, however, to prevent destruction of polarization information in the ferroelectric capacitor of an unselected cell, the plate lines are disconnected by the word lines and must be individually driven. Accordingly, a driving circuit of the plate lines PL0 and PL1 is as very large as 20% to 30% of the chip size, and the plate line driving time is long.

To solve the above problem, the present inventors have proposed a new nonvolatile ferroelectric memory capable of simultaneously achieving (1) a small memory cell, (2) a readily fabricable planar transistor, and (3) a versatile high-speed random access function, in Jpn. Pat. Appln. KOKAI Publication Nos. H10-255483, H11-177036, and 2000-22010 as prior applications.

FIG. 5B shows the arrangement of this ferroelectric memory of the above prior applications. In the prior applications, one memory cell is formed by connecting a cell transistor and ferroelectric capacitor in parallel, and one memory cell block is formed by connecting a plurality of parallel circuits of memory cells in series. One terminal of the block is connected to a bit line BL via a block select transistor, and the other terminal of the block is connected to a plate line PL.

The operation is as follows. In a standby state, all word lines WL0, WL1, . . . , WL3 are changed to High to turn on the memory cell transistors, and a block select signal BS is changed to Low to turn off the block select transistor. Since the two terminals of the ferroelectric capacitor are electrically shorted by the ON cell transistor, no potential difference is produced between them, so the stored polarization is stably held.

In an active state, only a memory cell transistor connected in parallel to a ferroelectric capacitor to be read is turned off, and the block select transistor is turned on. After that, the plate line PL and block select signal BS are changed to High. Accordingly, the potential difference between the plate line PL and bit line BL is applied only to the two terminals of a ferroelectric capacitor connected in parallel to the OFF memory cell transistor, so polarization information of this ferroelectric capacitor is read out to the bit line. Although the cells are connected in series, therefore, cell information of a given ferroelectric capacitor is read out by selecting a given word line, so complete random access can be realized. Also, since the plate line PL can be shared by a plurality of memory cells, it is possible to increase the area of a plate line driving circuit (PL driver) while the chip size is reduced, and to realize a high-speed operation.

In addition, the present inventors have proposed a ferroelectric memory capable of an ultra-high-speed operation in Jpn. Pat. Appln. KOKAI Publication No. 2004-263383. In this memory, as shown in FIG. 5C, a ferroelectric capacitor and cell transistor are connected in series to form each cell, and a plurality of cells are connected in parallel. A reset transistor is further connected in parallel to this parallel circuit, and the obtained parallel circuit is connected to a bit line via a block select transistor. This ferroelectric memory can achieve the effects of the prior applications described above, and can also further increase the operating speed by the effect of connecting the series circuits of cells in parallel. This is so because in the standby state, it is possible to short circuit all ferroelectric caps via the reset transistor by turning on all the cell transistors, and to share the plate driving line, unlike in the conventional ferroelectric memory.

An MRAM is also proposed as a nonvolatile memory capable of high-speed read/write. This MRAM is a memory in which a thin film of, e.g., $Al_2O_3$ is sandwiched by magnetic layers, and an electric current in the thin film increases if the spin directions in the upper and lower magnetic layers are the same, and reduces if the spin directions are opposite. This difference gives the memory a binary value. Although the MRAM is capable of high-speed read/write similarly to the FeRAM, the chip size is larger and the cost is higher than those of the NAND flash. A phase change memory (also called a PRAM) having a relatively short write time is also proposed, but the cost of this memory is also high.

BRIEF SUMMARY OF THE INVENTION

According to an aspect of the present invention, there is provided a memory system comprising a ferroelectric memory formed by arranging a plurality of memory cells having a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein data is programmed in the flash EEPROM by a write unit which is smaller than a block as an erase unit and larger than a page as a program unit, and the ferroelectric memory stores a logical address-physical address conversion table using the write unit.

According to another aspect of the present invention, there is provided a memory system comprising a ferroelectric memory formed by arranging a plurality of memory cells having a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein data is programmed in the flash EEPROM by a write unit which is smaller than a block as an erase unit, and the ferroelectric memory stores a logical address-physical address conversion table using the write unit.

BRIEF DESCRIPTION OF THE SEVERAL VIEWS OF THE DRAWING

FIGS. 4A and 4B are diagrams for explaining the problems of the multilevel operation of the conventional NAND flash EEPROM;

FIGS. 5A to 5C are circuit diagrams showing a conventional ferroelectric memory and ferroelectric memories of prior applications;

FIG. 11 is a block diagram showing a memory system according to the fourth embodiment of the present invention.

DETAILED DESCRIPTION OF THE INVENTION

Prior to the explanation of embodiments, the problems of conventional memory systems studied by the present inventors will be explained below with reference to FIGS. 6 and 7. After that, various embodiments of memory systems which solve the problems will be explained.

In the multilevel NAND flash EEPROM type nonvolatile memory as described above, the threshold voltage distribution must be tight, data cannot be written in an arbitrary page in a block, and the order of programmable pages in a block is fixed or limited. That is, no random write can be performed. If an instruction of random write is input, therefore, data is written block by block, and this largely decreases the effective write bandwidth.

Although a method of writing a logical address-physical address in each page is proposed, the start of the operation after the power supply is turned on is largely delayed. The logical address-physical address of each page may also be written in a fixed block, but the number of times of write is limited, and the logical address-physical address must be written in another block whenever data is written. This reduces the write performance by half.

Figure 1:
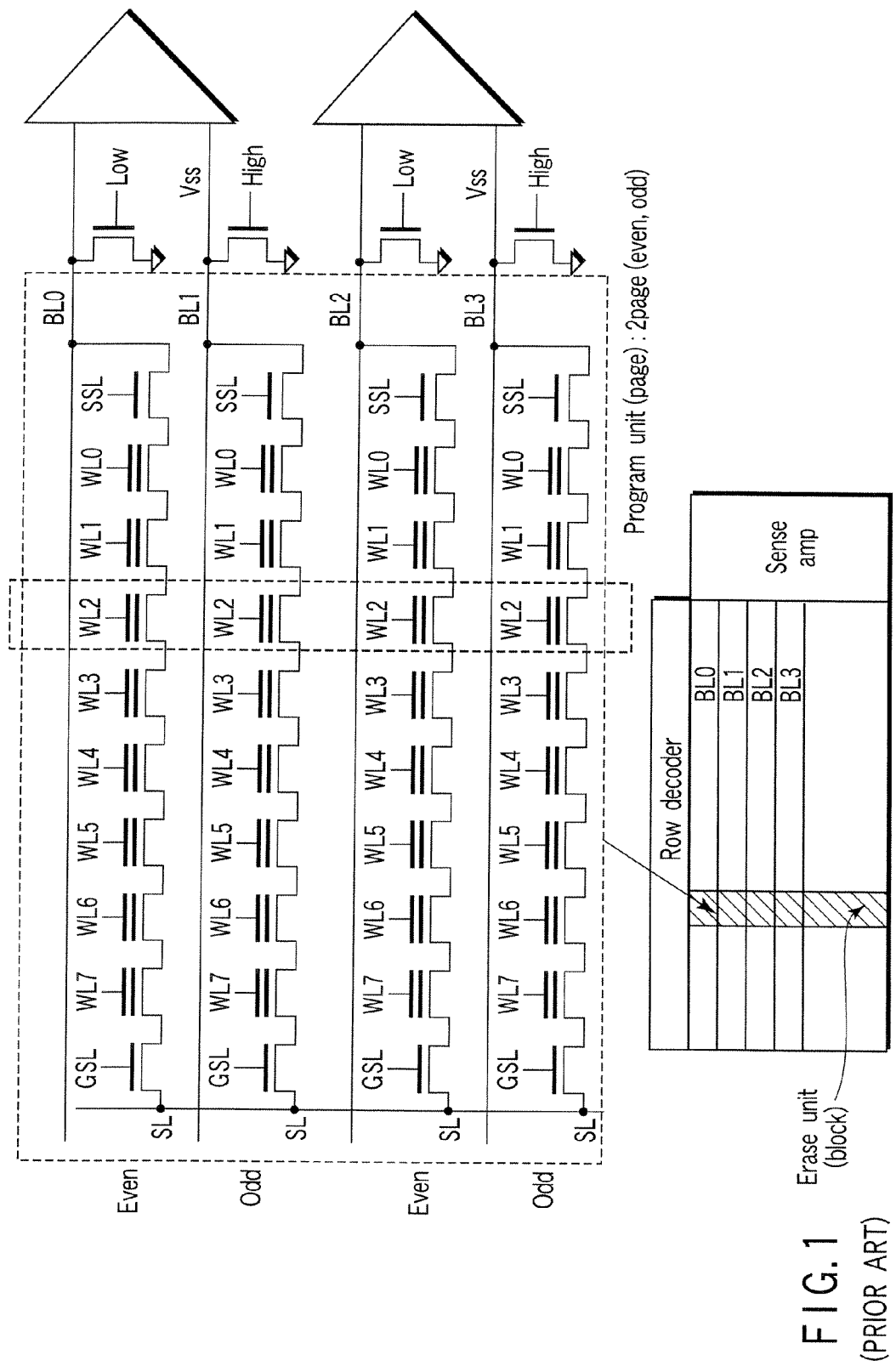
FIG. 1 shows a circuit diagram and block diagram of the arrangement of a conventional NAND flash EEPROM.
Figure 2:
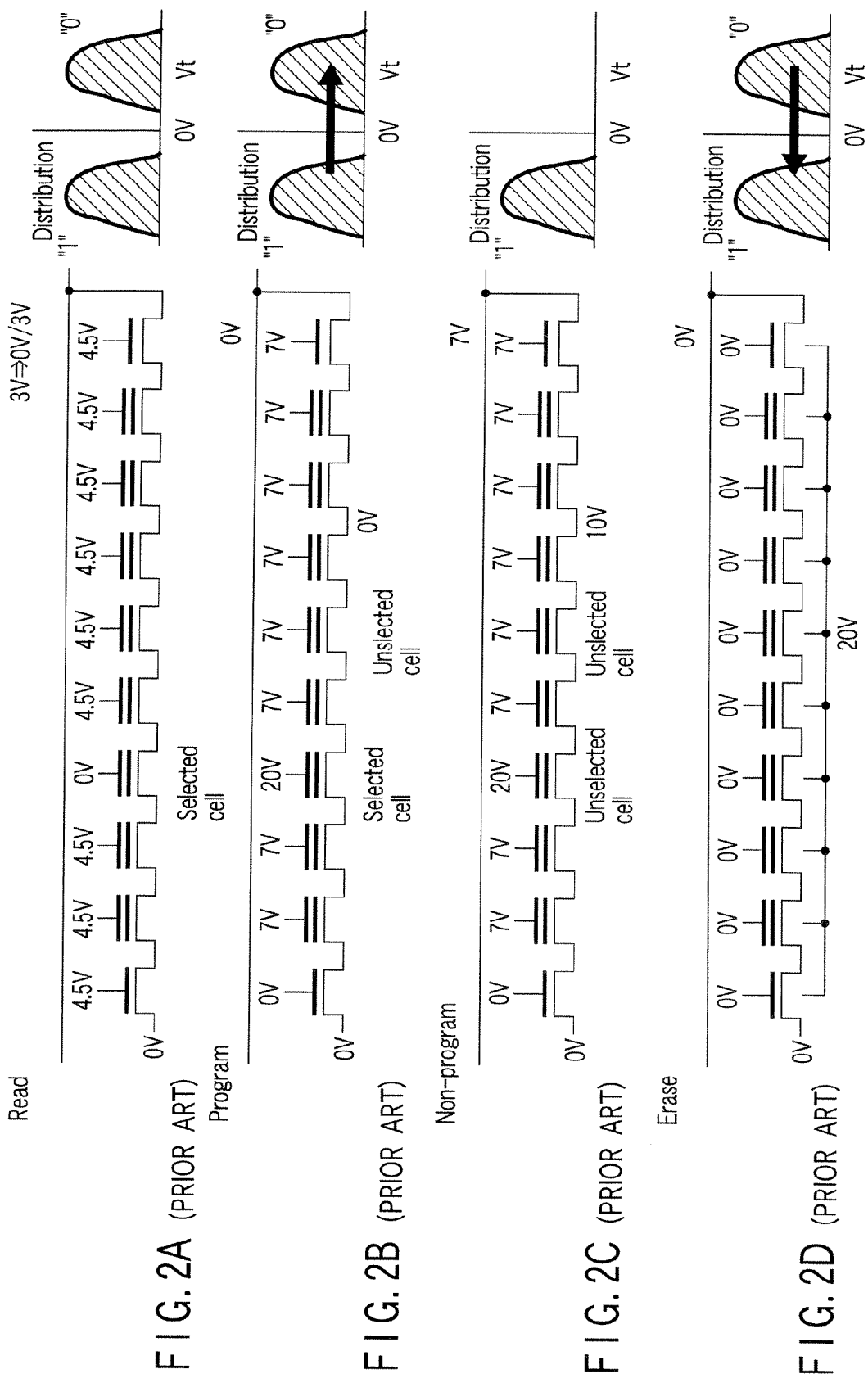
FIGS. 2A to 2D are circuit diagrams and cell transistor threshold voltage distribution graphs for explaining examples of the read, program, and erase operations of the conventional NAND flash EEPROM.
Figure 3:
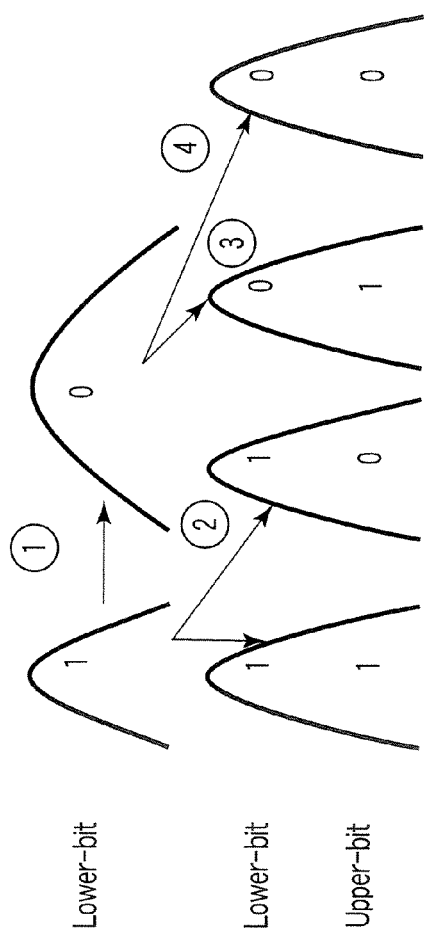
FIG. 3 is a diagram for explaining a multilevel operation of the conventional NAND flash EEPROM.
Figure 4A:
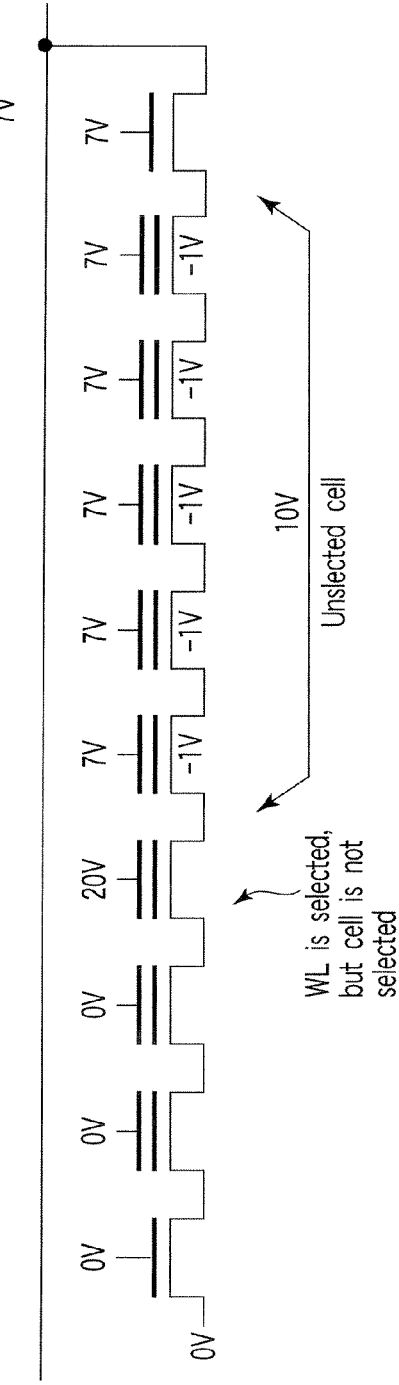
Figure 6:
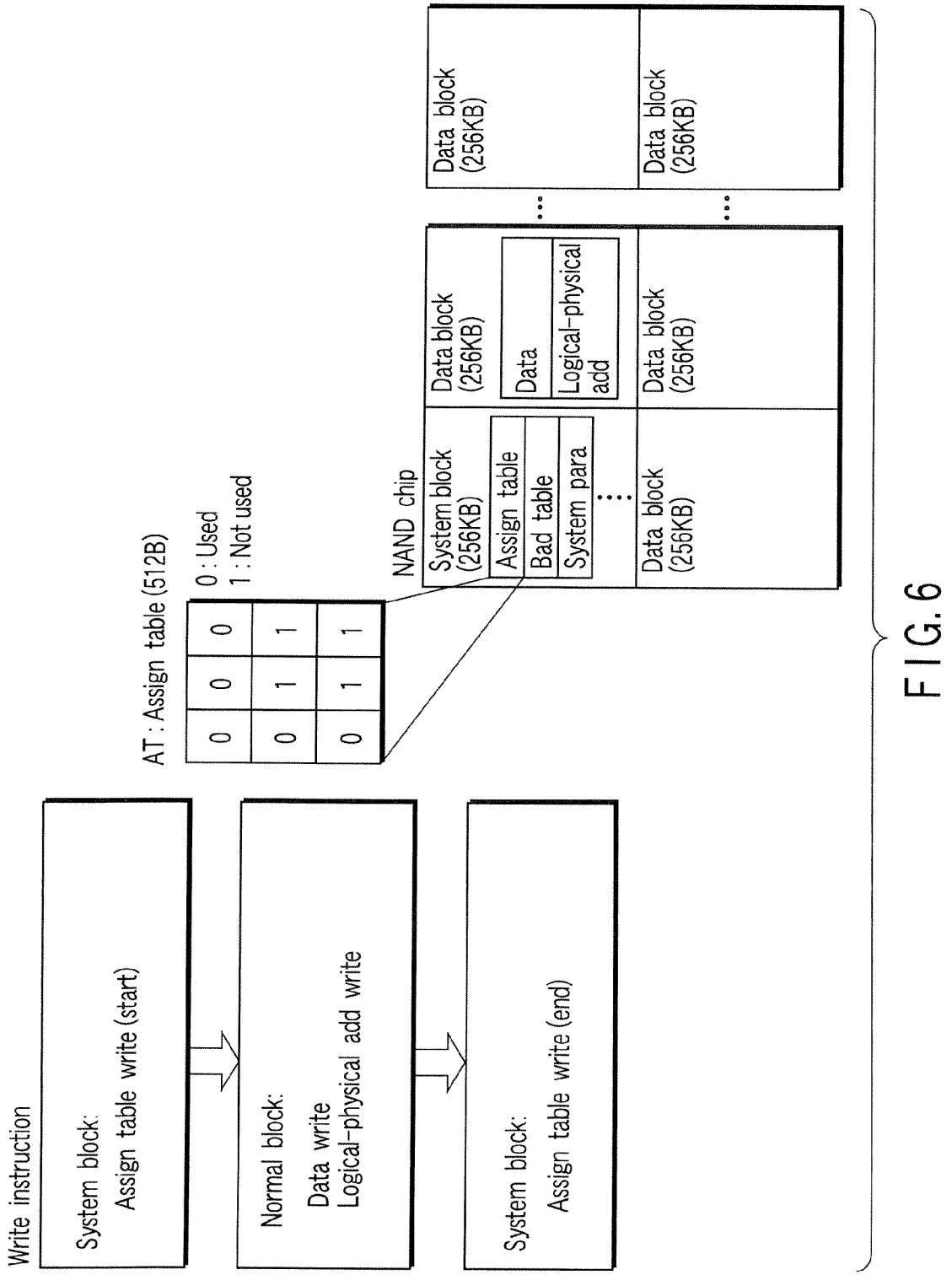
FIG. 6 is a schematic diagram for explaining the problem of a conventional memory system studied by the present inventors, in which an example of the operation of a memory card is illustrated.

To forcedly write data page by page, therefore, as shown in FIG. 6, it is possible to write the original logical address in each page. When the power supply is turned on (power-on), however, the logical address-physical address relationship is loaded into a controller from each page, so it takes a few seconds to start the operation from power-on. This makes the memory very inconvenient. It is also possible to store all logical addresses-physical addresses in a predetermined block. Since, however, the number of times of write increases, the method is unsuitable for the multilevel NAND flash EEPROM type nonvolatile memory in which the number of times of write is limited. Furthermore, the logical address-physical address must be written in another block whenever data is written. This reduces the write performance by half.

Figure 7:
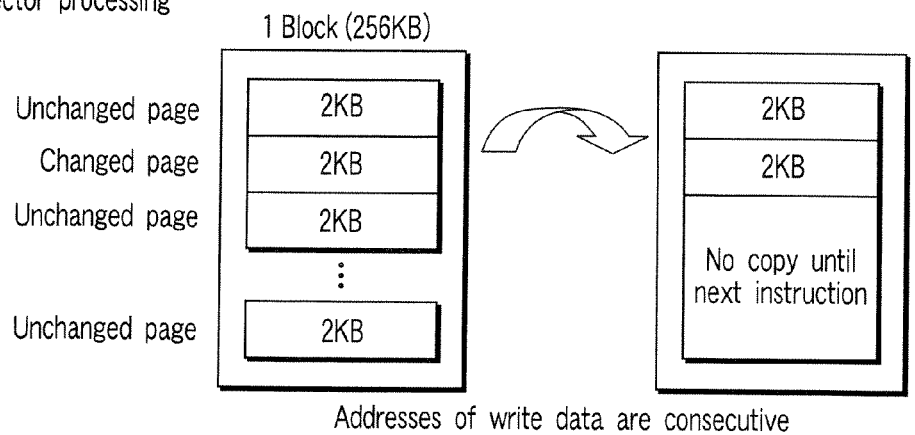
FIG. 7 is a schematic diagram for explaining the problem of a conventional memory system studied by the present inventors, in which an example of the operation of the conventional memory system is illustrated.

Also, when the contents of a certain page in a block are to be changed, as shown in FIG. 7, it is possible to write data as far as the page to be written, and stop copying of the remaining pages until the next write instruction is input. This is so because the next write may be performed on the next address. This method can give the memory slight write randomness. However, if real random address write such as an OS operation occurs, the method is totally useless; in order to write data in one page, it is necessary to write data in one block which is 64 times as large as the page. This largely deteriorates the effective write performance.

As described above, a memory system using a nonvolatile memory such as an FeRAM, MRAM, or PRAM capable of high-speed read/write can solve the various problems of the NAND flash, but the cost of the memory system is high.

The present invention is based on the consideration as described above, and has as its object to provide a large-capacity memory system capable of performing high-speed random read/write by a small unit at a low cost, by well combining a flash EEPROM and a nonvolatile memory such as an FeRAM, MRAM, or PRAM capable of high-speed read/write.

Embodiments of the present invention will be described below with reference to the accompanying drawing.

FIRST EMBODIMENT

Figure 8A:
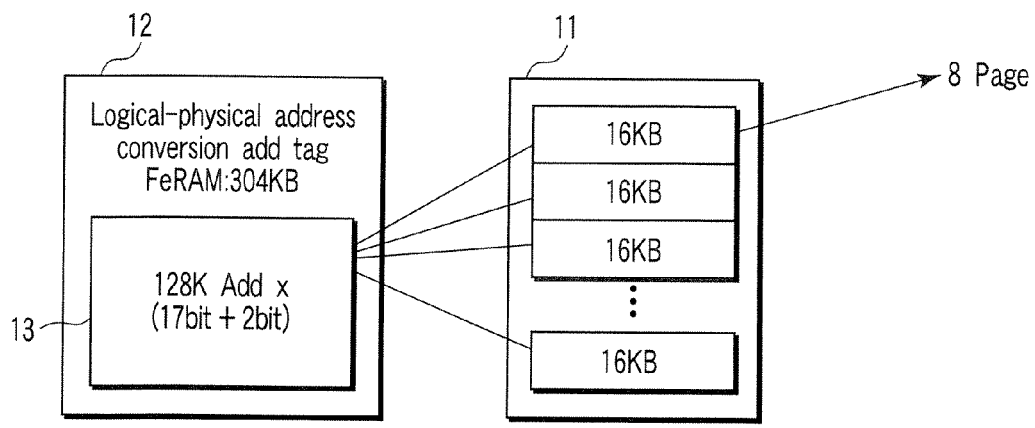
FIG. 8A is a block diagram for explaining a memory system according to the first embodiment of the present invention.

FIG. 8A is a diagram showing the arrangement of a memory system according to the first embodiment of the present invention. This memory system includes a NAND flash EEPROM (2 GB NAND) 11 which stores large-volume data, and a controller (NAND Controller) 12. The controller (control circuit) 12 contains a ferroelectric memory 13 which stores, e.g., system information, a logical address-physical address conversion table, and data.

As described previously, in a multilevel NAND flash EEPROM capable of realizing a large capacity, the page write order in each block is limited or fixed in order to prevent fluctuations of the boot voltage of the source-drain node of a cell transistor. This makes it difficult to perform random write by dividing a write unit to be smaller than the block size.

In this embodiment, however, addresses are allocated to write units smaller than the block size, and the ferroelectric memory 13 is given an actual logical address-physical address conversion table. Therefore, when viewed from outside the memory system, random read/write can be performed by a write unit smaller than the block size.

In this case, the speed of write to the ferroelectric memory 13 is 100 to 200 ns which is negligibly lower than a few hundred μs of the multilevel NAND flash EEPROM. Accordingly, the time of write to the logical-physical conversion table is negligibly short, so both random write and high-speed write can be realized.

In this embodiment, 2 GB are formed by the multilevel NAND flash EEPROM 11, the block size is 512 KB, the page size is 4 KB, and the apparent random write unit is 16 KB. In this case, the capacity of the logical-physical address conversion table necessary for the ferroelectric memory 13 is 128K addresses (19 bits each), so the necessary ferroelectric memory capacity is about 304 KB. Since the capacity of an expensive ferroelectric memory is small, the increase in cost is also small.

Figures 8B, 9:
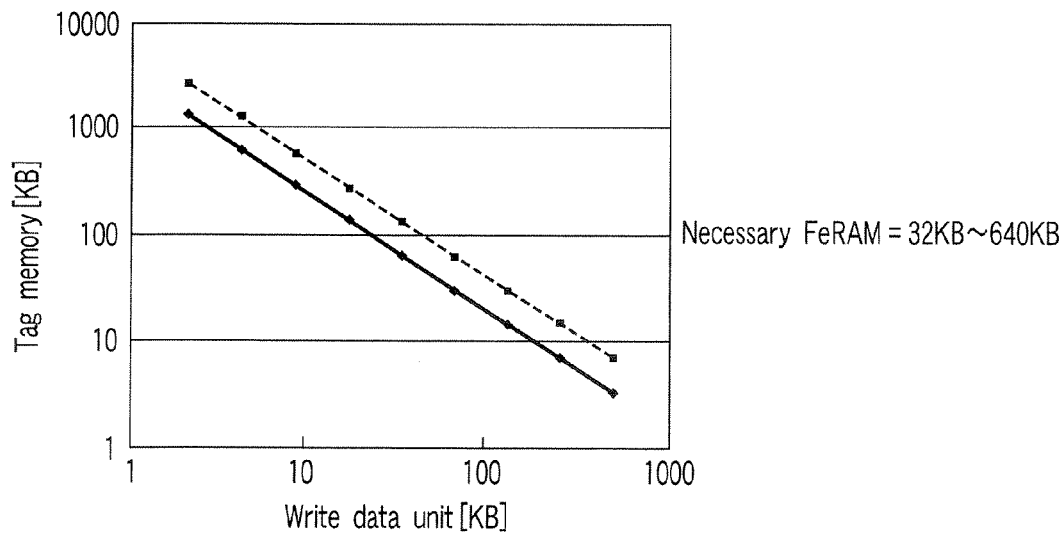
FIG. 8B is a graph for explaining the memory system according to the first embodiment of the present invention, in which the relationship between the apparent unit of random write and the necessary capacity of a ferroelectric memory is illustrated.
FIG. 9 is a diagram for explaining the second embodiment of the present invention, in which a logical-physical address conversion table, which is stored in a ferroelectric memory, of a multilevel NAND flash EEPROM is illustrated.

FIG. 8B shows the relationship between the apparent unit of random write and the necessary capacity of the ferroelectric memory 13. As the unit decreases within the range smaller than the block size, the random write performance improves, but the necessary capacity of the ferroelectric memory 13 increases. If the unit is the same as the page, a memory of 4 MB=64 Mb is necessary, but this memory is not so practical. Accordingly, it is ideal to set the unit at about 16 KB which is the average file size of an OS such as Windows (registered trademark). That is, it is preferable to satisfy the relationship of "page size<write unit<block size".

SECOND EMBODIMENT

FIG. 9 is a diagram for explaining the second embodiment of the present invention, in which data to be stored in a ferroelectric memory 13 shown in FIG. 8A is illustrated. Referring to FIG. 9, the left side indicates the address of a position where data is actually written by each write unit in a multilevel NAND flash EEPROM 11, the center indicates the logical address, and the right side indicates the data value, all of which are written in the ferroelectric memory 13. Random high-speed write can be realized by a small unit by storing a simple table like this.

THIRD EMBODIMENT

Figure 10:
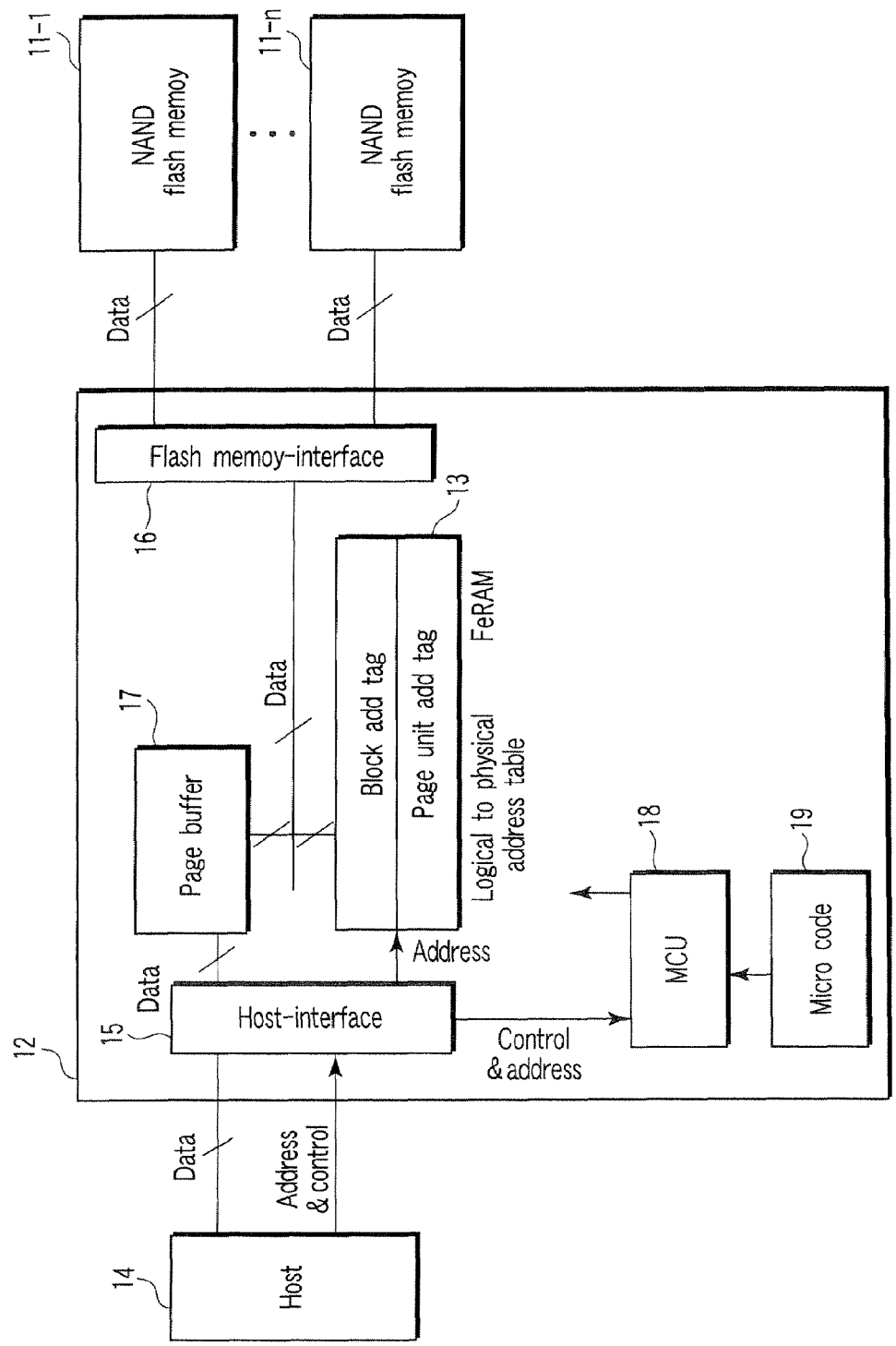
FIG. 10 is a block diagram showing a memory system according to the third embodiment of the present invention.

FIG. 10 is a block diagram showing a memory system according to the third embodiment of the present invention. This memory system includes NAND flash EEPROMs (NAND flash memories) 11-1, . . . , 11-n, a ferroelectric memory (FeRAM) 13, and a controller (NAND Flash memory Controller) 12. The controller 12 comprises an interface circuit (Host-Interface) 15 which interfaces with a host apparatus (Host) 14, an interface circuit (Flash Memory-Interface) 16 which interfaces with the NAND flash EEPROMs 11-1, . . . , 11-n, an MCU (Micro Control Unit) 18 which controls the whole controller 12, the NAND flash EEPROMs 11-1, . . . , 11-n, a page buffer 17, and the ferroelectric memory 13, and a micro code memory (Micro Code) 19 which stores instruction codes and the like of the MCU 18.

The ferroelectric memory 13 stores root information for storing data, directory information, the file name of the data, the file size of the data, file allocation table (FAT) information for storing the storage location of the data, write completion time information of the data, or the like.

In this configuration, the flash EEPROMs 11-1, . . . , 11-n having a large capacity but requiring a read start time, program time, and erase time are used as data storage memories requiring a large memory area, and the ferroelectric memory 13 having a small capacity but capable of high-speed read/write stores information which requires only a small-capacity memory area but must be written in a number of small-capacity locations whenever data is written. This information for storing data is root information, directory information, the file name of the data, the file size of the data, file allocation table information for storing the storage location of the data, or the write completion time of the data. In this manner, it is possible to practically largely reduce the time during which the system information is written, and greatly improve the performance of the entire OS system and the overall memory system.

Especially, when a data file size to be read or written is small, the effect of the present invention improves because the storage amount of the system information relatively increases. Also, the ferroelectric memory 13 stores a logical-physical address conversion table which uses a page unit as a write unit smaller than the block size, and a block logical-physical conversion table. This achieves substantially the same effects as the embodiments shown in FIGS. 8A, 8B, and 9. Accordingly, high-speed random write using a fine file unit and high-speed power-on can be realized.

FOURTH EMBODIMENT

FIG. 11 is a block diagram showing a memory system according to the fourth embodiment of the present invention. The arrangement is similar to FIG. 10 and achieves the same effects as FIG. 10. In addition, a ferroelectric memory 13 can be handled as a nonvolatile cache.

That is, a certain data area is secured in the ferroelectric memory 13. In a read operation, data is copied from flash EEPROMs 11-1, . . . , 11-n to the ferroelectric memory 13, and this information is read out from the memory system at the same time.

Since the once read logical address information is already stored in the ferroelectric memory 13, this information is read at a high speed from the second time. In this case, the addresses 11-1, . . . , 11-n of the flash EEPROMs are stored as tag information in the ferroelectric memory 13. The ferroelectric memory 13 also stores a used page which indicates whether a memory space is used. To write the once read address information from outside the memory system, the write operation is apparently completed only by writing the information in the ferroelectric memory 13.

In this case, however, the data values of the ferroelectric memory 13 are different from those of the flash EEPROMs 11-1, ..., 11-n, so a dirty page flag is raised. If the use ratio of the area of the ferroelectric memory 13 increases, the data values are written from the ferroelectric memory 13 back to the flash EEPROMs 11-1, ..., 11-n via a write-back buffer 20.

Since transfer from the ferroelectric memory 13 to the write-back buffer 20 is performed at a high speed, read/write to the area of the ferroelectric memory 13 can be performed while the data is slowly written from the write-back buffer 20 back to the flash EEPROMs 11-1, ..., 11-n, so the processing speed can be increased. This write-back from the ferroelectric memory 13 to the flash EEPROMs 11-1, ..., 11-n is started from data having a low access frequency. Therefore, the ferroelectric memory 13 has a counter memory for storing the access count. With this cache function, system information for storing data which is expected to be frequently accessed always resides on the ferroelectric memory, so the same effects as in FIG. 10 can be achieved. The system information is, e.g., root information, directory information, the file name of the data, the file size of the data, file allocation table (FAT) information storing the storage location of the data, or write completion time information of the data.

The system information and the data to be frequently accessed may also be held in the ferroelectric memory 13 by combining this memory system and FIG. 10. In the memory system as a whole, when read/write to the memory system is repeated, data to be frequently accessed is held in the ferroelectric memory 13, and the flash EEPROMs 11-1, ..., 11-n are not accessed, so the performance greatly improves. Especially, when the OS frequently accesses the memory by a small file unit as in a PC, the improvement in performance is remarkable.

Accordingly, it is possible to provide a large-capacity memory system capable of performing high-speed random read/write by a small unit at a low cost, by combining a flash EEPROM or the like and a nonvolatile memory such as an FeRAM, MRAM, or PRAM capable of high-speed read/write.

OUTLINES OF EMBODIMENTS

That is, the individual embodiments of the present invention use the following arrangements.

The first form of the present invention is a memory system characterized by comprising a ferroelectric memory formed by arranging a plurality of memory cells each having a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates externally, wherein data is programmed in the flash EEPROM by a first write unit which is smaller than a block as an erase unit and larger than a page as a program unit, and the ferroelectric memory stores a logical address-physical address conversion table using the first write unit.

The second form of the present invention is a memory system characterized by comprising a ferroelectric memory formed by arranging a plurality of memory cells each having a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates externally, wherein data is programmed in the flash EEPROM by a first write unit which is smaller than a block as an erase unit, and the ferroelectric memory stores a logical address-physical address conversion table using the first write unit.

The third form of the present invention is characterized by combining the first or second form and the third form, and is a memory system described in the first or second form, characterized in that the order of programming a plurality of first write units in a block is constant.

The fourth form is characterized by combining the first or second form and the fourth form, and is a memory system described in the first or second form, characterized in that the order of programming a plurality of first write units in a block is limited.

The fifth form is characterized by combining the third or fourth form and the fifth form, and is a memory system described in the third or fourth form, characterized in that a logical address and physical address corresponding to each first write unit are different.

The sixth form is characterized by combining the first or second form and the sixth form, and is a memory system described in the first or second form, characterized in that the flash EEPROM stores data, and the ferroelectric memory stores root information or directory information for storing the data, the file name of the data, the file size of the data, file allocation table information for storing the storage location of the data, or the write completion time of the data.

The seventh form of the present invention is characterized by combining the first or second form and the seventh form, and is a memory system described in the first or second form, characterized in that the control circuit or ferroelectric memory stores information which defines areas of a logical address space which are to be stored in the flash EEPROM and ferroelectric memory.

The eighth form of the present invention is characterized by combining the first or second form and the eighth form, and is a memory system described in the first or second form, characterized in that data having the same logical address is permitted to be stored in the flash EEPROM and ferroelectric memory, and the ferroelectric memory stores flag 1 indicating the permission of the storage, flag 2 information indicating whether contents of data stored in the same logical address of the flash EEPROM and ferroelectric memory are the same or different, information of the logical address, and a physical address to be stored in the flash EEPROM.

Each form of the present invention as has been explained in detail above makes it possible to provide a memory system which can perform high-speed random read/write by a write size smaller than a block without apparently lowering the speed, even when page write is limited as in a multilevel NAND flash EEPROM, and which can be used by, e.g., an OS which frequently performs random read/write.

Although each form is explained by taking a multilevel flash EEPROM as an example, the present invention is of course applicable to general binary flash EEPROMs.

As described above, according to one aspect of this invention, there is provided a memory system capable of increasing the speed of read/write while suppressing the increase in cost.

Additional advantages and modifications will readily occur to those skilled in the art. Therefore, the invention in its broader aspects is not limited to the specific details and representative forms shown and described herein. Accordingly, various modifications may be made without departing from the spirit or scope of the general inventive concept as defined by the appended claims and their equivalents.

What is claimed is:

1. A memory system comprising:
a ferroelectric memory formed by arranging a plurality of memory cells having a ferroelectric capacitor and a cell transistor;
a flash EEPROM formed by arranging a plurality of memory cells having a floating gate and configured to electrically erase and write data;
a control circuit configured to control the ferroelectric memory and the flash EEPROM; and
an interface circuit configured to communicate externally,
wherein data is programmed in the flash EEPROM by a write unit which is smaller than a block as an erase unit and larger than a page as a program unit, and
the ferroelectric memory stores a logical address-physical address conversion table using the write unit.

2. The system according to claim 1, wherein an order of programming a plurality of write units in a block of the flash EEPROM is constant.

3. The system according to claim 2, wherein a logical address and physical address corresponding to write unit are different.

4. The system according to claim 1, wherein an order of programming a plurality of write units in a block of the flash EEPROM is limited.

5. The system according to claim 4, wherein a logical address and physical address corresponding to write unit are different.

6. The system according to claim 1, wherein the flash EEPROM stores data, and the ferroelectric memory stores at least one of root information for storing the data, directory information for storing the data, a file name of the data, a file size of the data, file allocation table information for storing a storage location of the data, and write completion time of the data.

7. The system according to claim 1, wherein the control circuit stores information which defines areas of a logical address space which are to be stored in the flash EEPROM and the ferroelectric memory.

8. The system according to claim 1, wherein the ferroelectric memory stores information which defines areas of a logical address space which are to be stored in the flash EEPROM and the ferroelectric memory.

9. The system according to claim 1, wherein
data having the same logical address is permitted to be stored in the flash EEPROM and the ferroelectric memory, and
the ferroelectric memory stores a first flag indicating the permission of the storage, a second flag indicating whether contents of data stored in the same logical address of the flash EEPROM and the ferroelectric memory are the same or different, information of the logical address, and a physical address to be stored in the flash EEPROM.

10. A memory system comprising:
a ferroelectric memory formed by arranging a plurality of memory cells having a ferroelectric capacitor and a cell transistor;
a flash EEPROM formed by arranging a plurality of memory cells having a floating gate and configured to electrically erase and write data;
a control circuit configured to control the ferroelectric memory and the flash EEPROM; and
an interface circuit configured to communicate externally,
wherein data is programmed in the flash EEPROM by a write unit which is smaller than a block as an erase unit, and
the ferroelectric memory stores a logical address-physical address conversion table using the write unit.

11. The system according to claim 10, wherein an order of programming a plurality of write units in a block of the flash EEPROM is constant.

12. The system according to claim 11, wherein a logical address and physical address corresponding to write unit are different.

13. The system according to claim 10, wherein an order of programming a plurality of write units in a block of the flash EEPROM is limited.

14. The system according to claim 13, wherein a logical address and physical address corresponding to write unit are different.

15. The system according to claim 10, wherein the flash EEPROM stores data, and the ferroelectric memory stores at least one of root information for storing the data, directory information for storing the data, a file name of the data, a file size of the data, file allocation table information for storing a storage location of the data, and write completion time of the data.

16. The system according to claim 10, wherein the control circuit stores information which defines areas of a logical address space which are to be stored in the flash EEPROM and the ferroelectric memory.

17. The system according to claim 10, wherein the ferroelectric memory stores information which defines areas of a logical address space which are to be stored in the flash EEPROM and the ferroelectric memory.

18. The system according to claim 10, wherein
data having the same logical address is permitted to be stored in the flash EEPROM and the ferroelectric memory, and
the ferroelectric memory stores a first flag indicating the permission of the storage, a second flag indicating whether contents of data stored in the same logical address of the flash EEPROM and the ferroelectric memory are the same or different, information of the logical address, and a physical address to be stored in the flash EEPROM.

* * * * *